United States Patent
Ide et al.

(10) Patent No.: US 9,898,118 B2
(45) Date of Patent: Feb. 20, 2018

(54) DISPLAY DEVICE

(71) Applicant: Japan Display Inc., Minato-ku (JP)

(72) Inventors: Tatsuya Ide, Tokyo (JP); Toshimasa Ishigaki, Tokyo (JP); Daisuke Sonoda, Tokyo (JP)

(73) Assignee: Japan Display Inc., Minato-ku (JP)

( * ) Notice: Subject to any disclaimer, the term of this patent is extended or adjusted under 35 U.S.C. 154(b) by 88 days.

(21) Appl. No.: 14/945,842

(22) Filed: Nov. 19, 2015

(65) Prior Publication Data

US 2016/0154510 A1    Jun. 2, 2016

(30) Foreign Application Priority Data

Nov. 27, 2014   (JP) ................. 2014-239809

(51) Int. Cl.

| G06F 3/041 | (2006.01) |
|---|---|
| G06F 3/044 | (2006.01) |
| B32B 37/12 | (2006.01) |
| B32B 38/10 | (2006.01) |
| H05K 1/18 | (2006.01) |
| B32B 37/24 | (2006.01) |
| B32B 38/00 | (2006.01) |

(52) U.S. Cl.
CPC ............ *G06F 3/0412* (2013.01); *B32B 37/12* (2013.01); *B32B 38/10* (2013.01); *G06F 3/044* (2013.01); *B32B 2037/243* (2013.01); *B32B 2038/0076* (2013.01); *B32B 2255/24* (2013.01); *B32B 2307/412* (2013.01); *B32B 2307/42* (2013.01); *B32B 2307/542* (2013.01); *B32B 2457/20* (2013.01); *G06F 2203/04103* (2013.01); *G06F 2203/04112* (2013.01); *H05K 1/189* (2013.01); *H05K 2201/10128* (2013.01)

(58) Field of Classification Search
CPC combination set(s) only.
See application file for complete search history.

(56) References Cited

U.S. PATENT DOCUMENTS

| 2008/0026206 A1* | 1/2008 | Matsumoto ............ C09J 7/0296 |
|---|---|---|
| | | 428/327 |
| 2014/0014400 A1* | 1/2014 | Mori .................. B29C 45/1418 |
| | | 174/254 |
| 2014/0036170 A1* | 2/2014 | Nashiki ................... G06F 3/044 |
| | | 349/12 |

(Continued)

FOREIGN PATENT DOCUMENTS

| JP | 2014-146365 | 8/2014 |
|---|---|---|
| JP | 2014-178847 | 9/2014 |

*Primary Examiner* — Van Chow
(74) *Attorney, Agent, or Firm* — Oblon, McClelland, Maier & Neustadt, L.L.P.

(57) ABSTRACT

According to one embodiment, a position detecting substrate includes a first base material, a sensing electrode formed of metal on the first base material and configured to detect a position, an adhesive layer facing the first base material and the sensing electrode and including a resin, and a second base material adhered to the sensing electrode by the adhesive layer, wherein assuming the force required to peel the sensing electrode from the first base material to be A, the force required to peel the adhesive layer from the first base material to be B and the force required to peel the second base material from the adhesive layer to be C, then A>B, or A>C.

14 Claims, 6 Drawing Sheets

(56) References Cited

U.S. PATENT DOCUMENTS

| | | | |
|---|---|---|---|
| 2014/0071353 A1* | 3/2014 | Nashiki | G02F 1/13338 349/12 |
| 2014/0248817 A1* | 9/2014 | Noma | G06F 3/041 445/24 |
| 2014/0267159 A1 | 9/2014 | Miyazaki et al. | |
| 2015/0261332 A1* | 9/2015 | Nakamura | G06F 3/0412 345/173 |
| 2016/0118638 A1* | 4/2016 | Gronwald | H01M 2/1673 429/126 |
| 2016/0154510 A1* | 6/2016 | Ide | B32B 37/12 345/174 |
| 2016/0225792 A1* | 8/2016 | Hwang | H01L 22/14 |

* cited by examiner

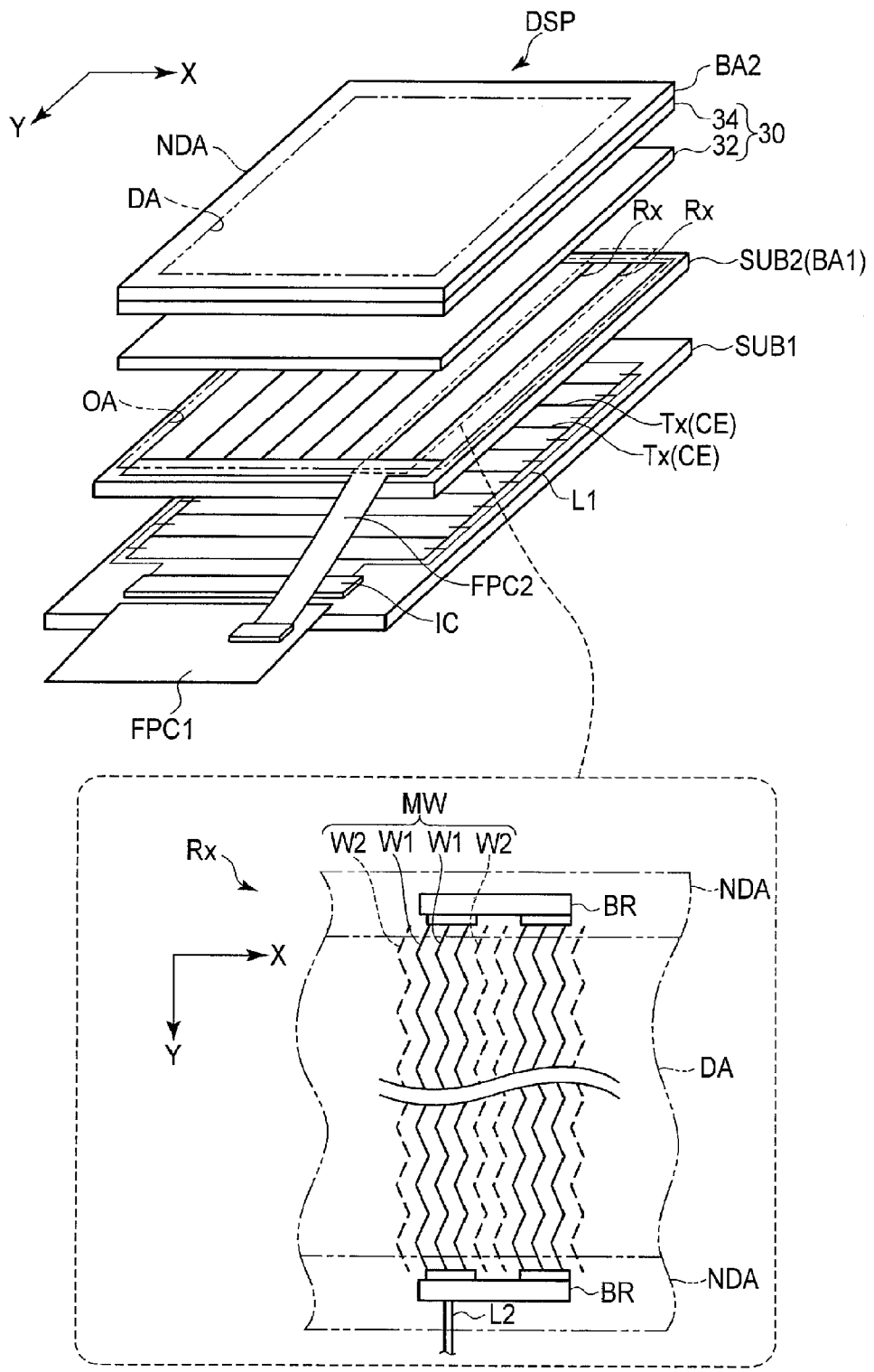
F I G. 2

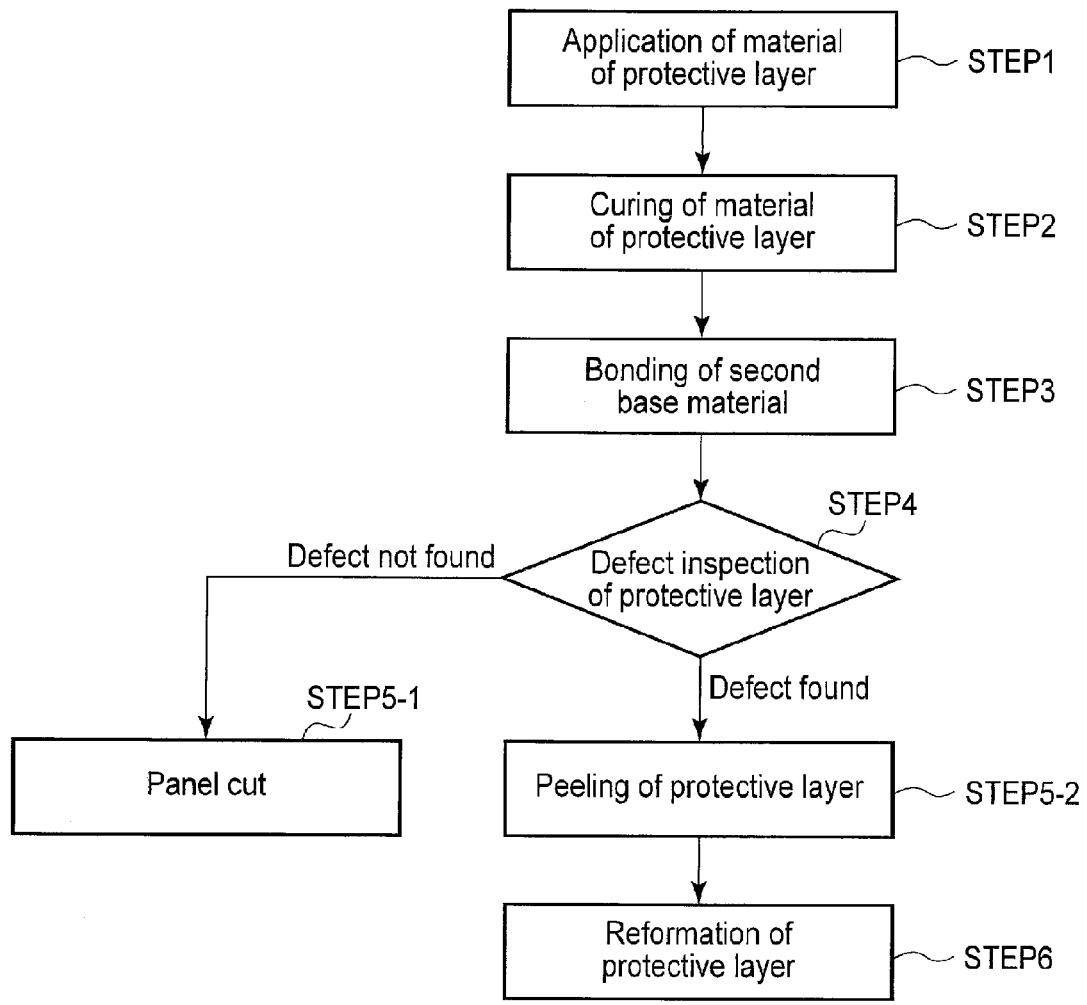
F I G. 4

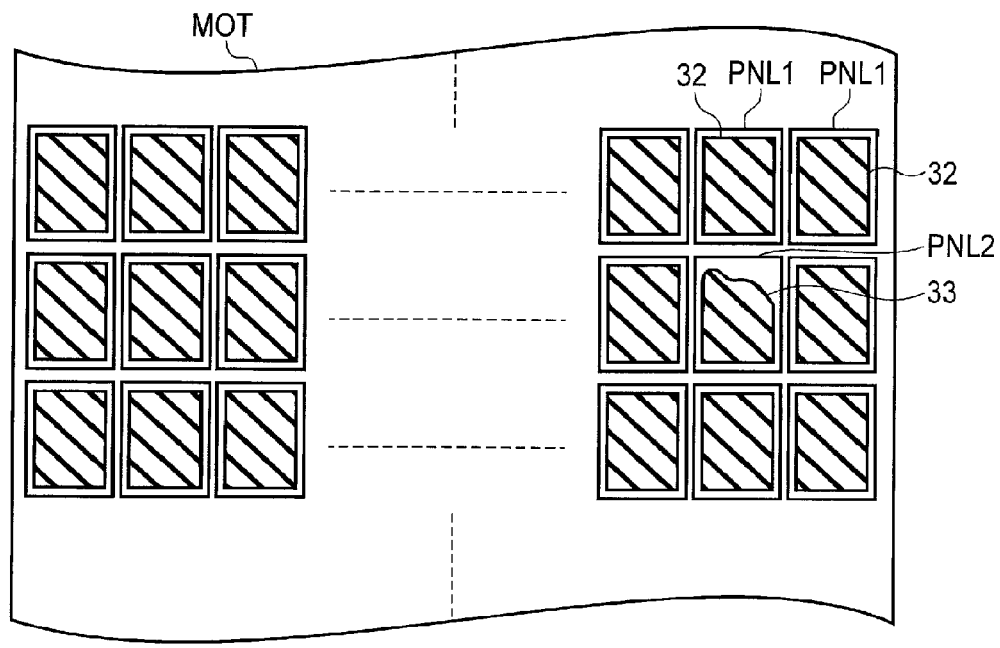
F I G. 5
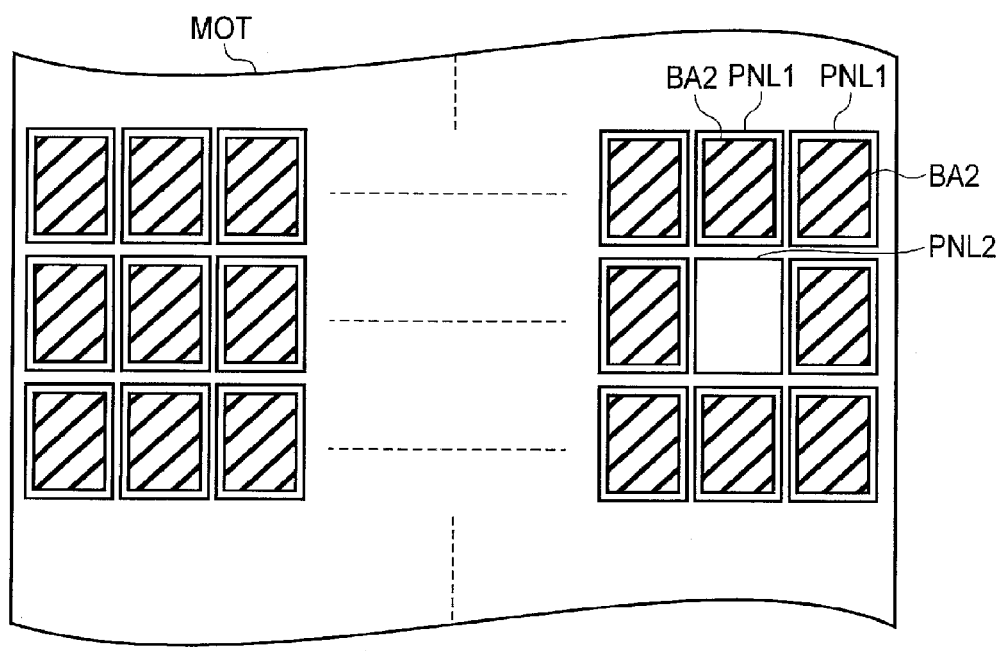
F I G. 6

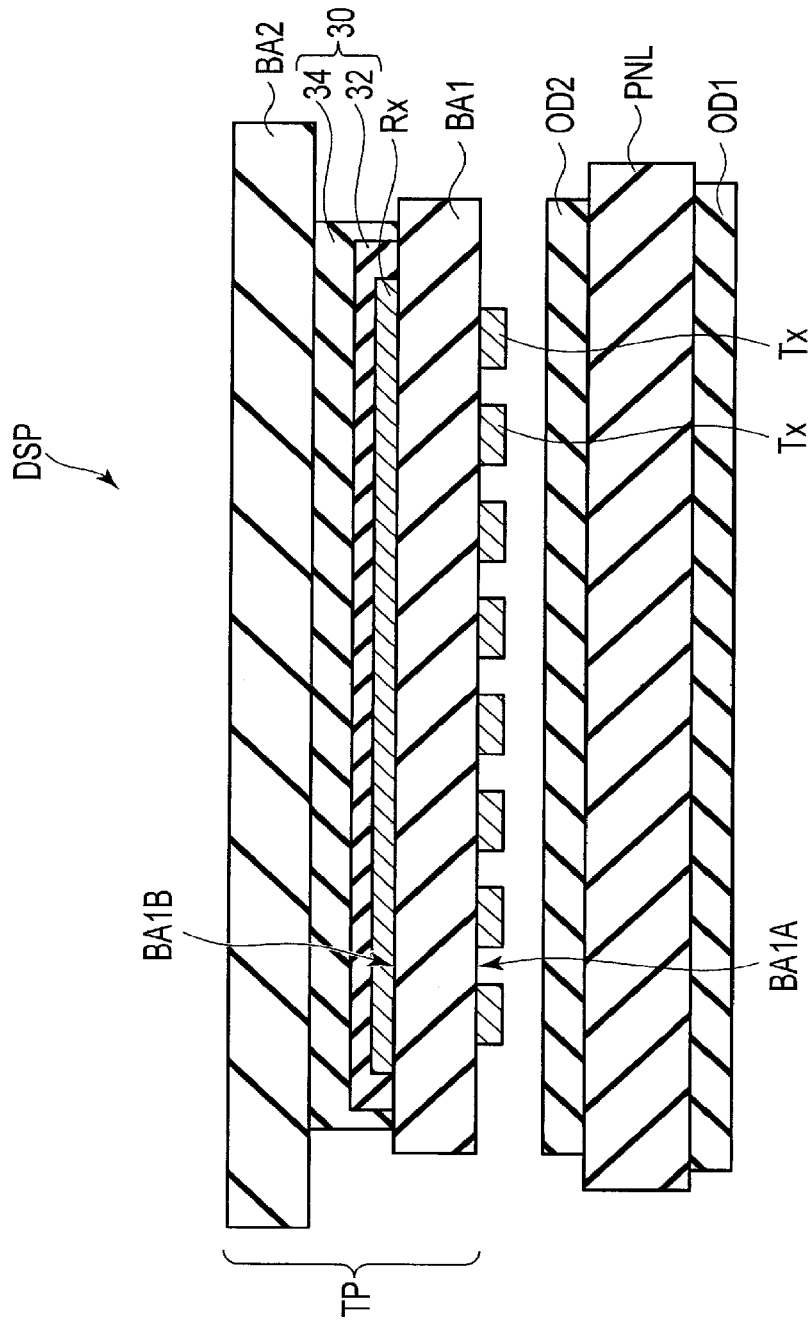
F I G. 7

DISPLAY DEVICE

CROSS-REFERENCE TO RELATED APPLICATIONS

This application is based upon and claims the benefit of priority from Japanese Patent Application No. 2014-239809, filed Nov. 27, 2014, the entire contents of which are incorporated herein by reference.

FIELD

Embodiments described herein relate generally to a position detecting substrate and a display device.

BACKGROUND

As an input device of a display device, for example, a capacitive touch panel is used. Such a touch panel comprises a position detecting substrate for detecting a position that an object has touched or approached.

BRIEF DESCRIPTION OF THE DRAWINGS

FIG. 2 is a schematic view of a display device comprising the position detecting substrate and the display panel.

FIG. 4 is a flowchart partially showing a manufacturing process of the display device.

FIG. 5 is an illustration of a mother panel in the step "Curing of material of protective layer" shown in FIG. 4.

FIG. 6 is an illustration of the mother panel in the step "Peeling of protective layer" shown in FIG. 4.

FIG. 7 is a cross-sectional view of another display panel comprising the position detecting substrate.

DETAILED DESCRIPTION

Figure 1:
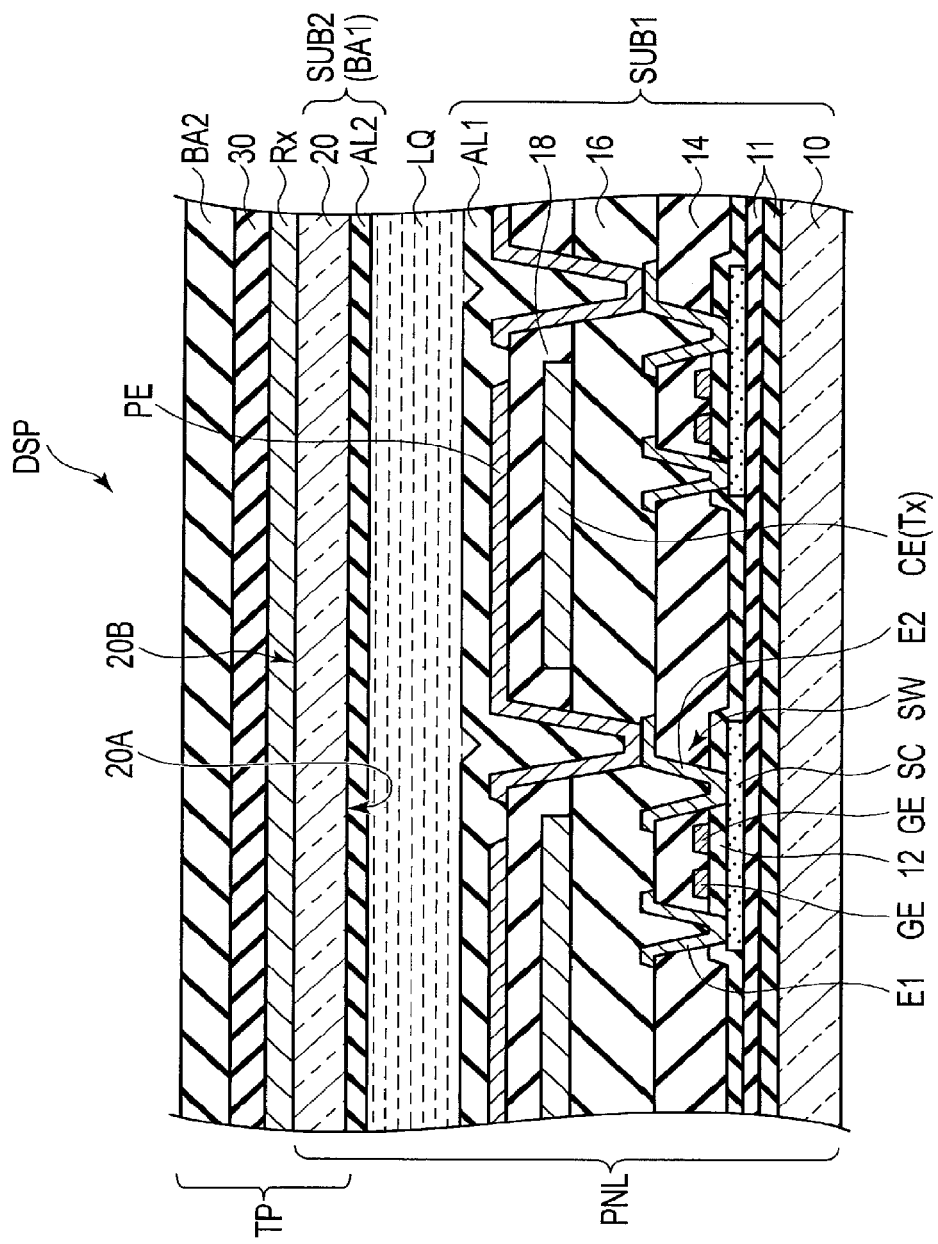
FIG. 1 is a cross-sectional view of a display panel comprising a position detecting substrate.

In general, according to one embodiment, a position detecting substrate comprises: a first base material; a sensing electrode formed of metal on the first base material and configured to detect a position; an adhesive layer facing the first base material and the sensing electrode and including a resin; and a second base material adhered to the sensing electrode by the adhesive layer, wherein assuming the force required to peel the sensing electrode from the first base material to be A, the force required to peel the adhesive layer from the first base material to be B, and the force required to peel the second base material from the adhesive layer to be C, then A>B, or A>C.

According to another embodiment, a position detecting substrate comprises: a first base material; a sensing electrode formed of metal on the first base material and configured to detect a position; an adhesive layer facing the first base material and the sensing electrode and including a resin; and a second base material adhered to the sensing electrode by the adhesive layer, wherein the resin is formed by polymerizing (meth)acrylate monomers having no hydroxy group.

According to another embodiment, a display device comprising: a first substrate; a second substrate facing the first substrate; a sensing electrode formed of metal on a principal surface side of the second substrate opposite to a side facing the first substrate and configured to detect a position; an adhesive layer facing the second substrate and the sensing electrode and including a resin; and a base material adhered to the sensing electrode by the adhesive layer, wherein assuming force required to peel the sensing electrode from the second substrate to be A, force required to peel the adhesive layer from the second substrate to be B, and force required to peel the base material from the adhesive layer to be C, then A>B, or A>C.

The embodiments will be described hereinafter with reference to the accompanying drawings. The disclosure is merely an example, and proper changes within the spirit of the invention, which are easily conceivable by a skilled person, are included in the scope of the invention as a matter of course. In the drawings, a width, thickness, shape and the like of each element are often shown schematically in comparison with an actual state to clarify descriptions, but these are merely an example and do not limit interpretation of the invention. In the specification and the drawings, a constituent element that performs a function equivalent or similar to that of the constituent element already described with reference to the preceding drawing is often represented by the same reference number and the overlapping detailed description is omitted as appropriate.

In the present embodiment, a liquid crystal display device is disclosed as an example of a display device. The liquid crystal display device can be applied to various devices such as a smartphone, a tablet, a cellular phone, a personal computer, a television receiver, an in-car device, a game console and the like. The main structure disclosed in each embodiment may also be applied to a selfluminescent display device having an organic electroluminescent display element, etc., an electronic paper display device having an electrophoretic element, etc., a display device using a microelectromechanical system (MEMS), a display device using electrochromism, and the like.

FIG. 1 is a cross-sectional view of a display panel comprising a position detecting substrate.

A display device DSP comprises a display panel PNL and a position detecting substrate IP. The display panel PNL comprises a first substrate SUB1, a second substrate SUB2 and a liquid crystal layer LQ.

The first substrate SUB1 comprises a first insulating substrate 10, an undercoat layer 11, switching elements SW, a first insulating film 12, a second insulating film 14, a third insulating film 16, common electrodes CE, a fourth insulating film 18, pixel electrodes PE and a first alignment film AL1. In the following description of the first substrate SUB1, the side of the second substrate SUB2 is defined as the upper side.

The first insulating substrate 10 is formed of an insulating material having a light transmitting property such as glass and resin. The undercoat layer 11 is formed on the first insulating substrate 10. The undercoat layer 11 may be constituted by a single layer or laminated two or more layers.

The switching elements SW are formed on a side of the first insulating substrate 10 facing the second substrate SUB2. Each switching element SW comprises a semiconductor layer SC, gate electrodes GE, a first electrode E1 and a second electrode E2. In the example illustrated, each switching element SW is formed by a top-gate-type thin-film transistor having a double-gate structure in which two gate electrodes GE are located above the semiconductor layer SC. However, the structure of the switching elements SW is not limited to the example illustrated. For example, each switching element SW may be formed by a bottom-gate-type thin-film transistor in which the semiconductor layer SC is located above the gate electrodes GE. The gate structure may be a single-gate structure in which a single gate electrode GE faces the semiconductor layer SC. The semiconductor layer SC is formed on the undercoat layer 11. The first insulating film 12 covers the undercoat layer 11 and the semiconductor layer SC. The two gate electrodes GE electrically connected to each other are formed on the first insulating film 12 and face the semiconductor layer SC. The second insulating film 14 covers the first insulating film 12 and the gate electrodes GE. The first and second electrodes E1 and E2 are spaced out on the second insulating film 14. Each of the first and second electrodes E1 and E2 is electrically connected to the semiconductor layer SC via a contact hole penetrating the first and second insulating films 12 and 14. The gate electrodes GE are electrically connected to a signal line supplied with a first signal (scanning signal) and the first electrode E1 is electrically connected to a signal line supplied with a second signal (image signal) different from the first signal, but their detailed description is omitted.

The third insulating film 16 covers the second insulating film 14 and the first and second electrodes E1 and E2. The common electrodes CE are formed on the third insulating film 16. The fourth insulating film 18 covers the third insulating film 16 and the common electrodes CE. The pixel electrodes PE are formed on the fourth insulating film 18 and face the common electrodes CE. Each pixel electrode PE is electrically connected to the second electrode E2 via a contact hole penetrating the third and fourth insulating films 16 and 18. The first alignment film AL1 covers the fourth insulating film 18 and the pixel electrodes PE.

The second substrate SUB2 comprises a second insulating substrate 20 and a second alignment film AL2. The second insulating substrate 20 is formed of an insulating material having a light transmitting property as with the first insulating substrate 10. The second alignment film AL2 is formed on a first principal surface 20A side of the second insulating substrate 20 facing the first substrate SUB1. The second substrate SUB2 may further comprise a light-shielding layer, color filters, an overcoat layer and the like (not shown) between the second insulating substrate 20 and the second alignment film AL2. The color filters may be provided in the first substrate SUB1. The liquid crystal layer LQ is held between the first substrate SUB1 and the second substrate SUB2.

The first and second alignment films AL1 and AL2 are subjected to alignment treatment such as photoalignment treatment or rubbing treatment. When no voltage is applied to the pixel electrodes PE, liquid crystal molecules in the liquid crystal layer LQ are aligned in the direction of the alignment treatment (initial alignment). This state is called an OFF state. When voltage is applied to the pixel electrodes PE, an electric field having intensity depending on potential difference is generated between the pixel electrodes PE and the common electrodes CE. The pixel electrodes PE comprise comb-like slits (not shown). The electric field between the pixel electrodes PE and the common electrodes CE is generated in a direction substantially perpendicular to a direction of extension of the slits. The liquid crystal molecules are aligned in a direction different from the initial alignment depending on the intensity of the electric field. This state is called an ON state. The display panel PNL displays images by switching between the OFF state and the ON state for each pixel.

The position detecting substrate TP comprises a first base material BA1, sensing electrodes Rx, an adhesive layer 30 and a second base material BA2. The first base material BA1 corresponds to at least the second insulating substrate 20 of the aforementioned second substrate SUB2. The sensing electrodes Rx are formed on a side of the first base material BA1 opposite to a side facing the liquid crystal layer LQ. In the example illustrated, the sensing electrodes Rx are formed on a second principal surface 20B of the second insulating substrate 20 opposite to the first principal surface 20A. The sensing electrodes Rx are formed of a metal material to be described later and are used to detect a position that an object has touched or approached. The adhesive layer 30 covers the sensing electrodes Rx. The second base material BA2 is adhered to the sensing electrodes Rx by the adhesive layer 30. The second base material BA2 is, for example, a polarizer.

Other conductive layers and insulating layers may be provided between the second principal surface 20B and the sensing electrodes Rx and between the sensing electrodes Rx and the adhesive layer 30. The second base material BA2 is not limited to a polarizer as long as it is a transparent base material. For example, the second base material BA2 may be transparent resin or glass. When the second base material BA2 is a polarizer, the second base material BA2 may include not only a polarizer layer but also optical layers such as a retardation layer and a diffusion layer.

In the example illustrated, the position detecting substrate TP is part of a capacitive touch panel using, for example, a mutual capacitance sensing method. The common electrodes CE correspond to driving electrodes Tx. That is, the common electrodes CE are supplied with common voltage necessary for image display during a writing period of writing an image signal to the pixel electrodes PE, and supplied with a sensor driving signal necessary for sensing during a sensing period of sensing the object touching or approaching the display device DSP. The first base material BA1 and the liquid crystal layer LQ are provided as a dielectric between the driving electrodes Tx and the sensing electrodes Rx.

During the sensing period, the touch panel applies the sensor driving signal to the driving electrodes Tx, reads a sensing signal according to the capacitance between the driving electrodes Tx and the sensing electrodes Rx from the sensing electrodes Rx, and detects a position the object has touched or approached. However, the touch panel may use a self capacitance sensing method. In this case, the position of the object can be detected based on the capacitance of the sensing electrodes of the position detecting substrate without the need of using the driving electrodes Tx.

The illustrated display panel PNL has a structure conforming to a fringe-field switching (FFS) mode, but may have a structure conforming to other modes. For example, the display panel PNL may have a structure conforming to an in-plane switching (IPS) mode, a vertical aligned (VA) mode and a twisted nematic (TN) mode.

FIG. 2 is a schematic view of the display device comprising the position detecting substrate and the display panel. The first direction X in FIG. 2 is a direction of extension of the short sides of the first substrate SUB1 and the second substrate SUB2. The second direction Y is a direction crossing the first direction X, i.e., a direction of extension of the long sides of the first substrate SUB1 and the second substrate SUB2.

The first substrate SUB1 comprises the driving electrodes Tx (or common electrodes CE), an integrated circuit chip IC, a first lead L1 and a first flexible printed circuit board FPC1. The driving electrodes Tx extend in the first direction X and are arranged in the second direction Y. The driving electrodes Tx are formed of a transparent conductive material such as indium tin oxide (ITO) or indium zinc oxide (IZO). The integrated circuit chip IC is provided in an area of the first substrate SUB1 not facing the second substrate SUB2. The integrated circuit chip IC is electrically connected to the driving electrodes Tx via the first lead L1. The first flexible printed circuit board FPC1 is electrically connected to an external control device (not shown). In the first substrate SUB1, the driving electrodes Tx may extend in a direction different from the first direction X, for example, the second direction Y, and be arranged in a direction different from the second direction Y, for example, the first direction X. The integrated circuit chip IC may be provided on the first flexible printed circuit board FPC1. The driving electrodes Tx may be electrically connected to the first flexible printed circuit board FPC1 via the first lead L1.

The second substrate SUB2 (first base material BA1) comprises the sensing electrodes Rx and a second flexible printed circuit board FPC2. The sensing electrodes Rx are arranged to cross the driving electrodes Tx. In the example illustrated, the sensing electrodes Rx extend in the second direction Y and are arranged in the first direction X. One end of the second flexible printed circuit board FPC2 is electrically connected to the sensing electrodes Rx and the other end is electrically connected to the first flexible printed circuit board FPC1.

As shown in the enlarged view in FIG. 2, each sensing electrode Rx comprises metal lines MW and bridge portions BR. The metal lines MW include thinned sensing lines W1 and dummy lines W2. The sensing lines W1 extend in the shape of continuous zigzag lines along the second direction Y in a display area DA in which an image is displayed. In the display area DA, the dummy lines W2 are separated from the sensing lines W1 and extend discontinuously and substantially parallel to the sensing lines W1. The sensing lines W1 and the dummy lines W2 are spaced at regular intervals in the first direction X. The bridge portions BR extend in the first direction X in a non-display area NDA located outside the display area DA. The bridge portions BR electrically connect the sensing lines W1. The bridge portions BR are electrically connected to a second lead L2. The bridge portions BR are not connected to the dummy lines W2.

The metal lines MW are formed of a metal material. The metal material is not limited to a specific type, but should preferably be a material having excellent conductivity. For example, the metal material may be gold, silver, copper, aluminum, indium, tungsten, rhodium, iridium, chromium or the like, and should preferably be silver or aluminum. In addition, the metal lines MW may have a laminated structure of several materials in order to form a diffusion barrier layer and an antireflection layer. For example, the metal lines MW may be formed of a material comprising a barrier layer formed on the second substrate SUB2, an aluminum (Al) alloy layer laminated on the barrier layer, and a cap layer laminated on the aluminum alloy layer. The barrier layer and the cap layer are formed of molybdenum (Mo) alloy and have the effect of reducing deterioration of Al alloy caused by oxidation, etc. The metal lines MW should preferably comprise a low-reflection layer on the cap layer. The low-reflection layer is, for example, a laminated layer of three layers having different refractive indexes. The low-reflection layer reduces deterioration of display quality of the display device DSP caused by reflection of external light. The bridge portions BR and the second lead L2 should preferably be formed of the same metal material as the metal lines MW.

Each sensing electrode Rx may further comprise a strip-shaped transparent electrode. The transparent electrode and the metal lines MW are laminated. The transparent electrode is formed of a transparent conductive material such as ITO or IZO. The shape of the sensing electrodes Rx, the shape of the metal lines MW, the number of the metal lines MW, etc., are not limited to the example illustrated.

The resistance of the above-described sensing electrodes Rx comprising the metal lines MW can be lowered in comparison with sensing electrodes constituted only by transparent electrodes. Therefore, the increase in resistance and capacitance of the sensing electrodes Rx comprising the metal lines MW can be reduced. In particular, it is effective to apply the sensing electrodes Rx of the present invention to a display device DSP having a large display area DA measuring more than 5 inches diagonally since the sensing electrodes Rx are longer and finer in such a display device. In addition, it is extremely effective to apply the sensing electrodes Rx of the present invention to a display device DSP having a display area DA of a resolution of 300 main pixels or more per inch, more specifically, 350 main pixels or more per inch, since a longer period is required for writing an image signal to a pixel electrode of each pixel in a frame and a sufficient sensing period cannot be secured in such a display device. Each main pixel includes at least a red pixel displaying red color, a green pixel displaying green color and a blue pixel displaying blue color as subpixels, but their detailed description is omitted.

The adhesive layer 30 adheres the second base material BA2 to the first base material BA1 (or second substrate SUB2) and the sensing electrodes Rx. For example, the adhesive layer 30 has a double-layered structure and comprises a protective layer 32 and an adhesive member 34 each including resin. The protective layer 32 covers the first base material BA1 and the sensing electrodes Rx. The protective layer 32 is formed of a transparent resin material. The protective layer 32 is provided to prevent deformation and breaking of the sensing electrodes Rx. Therefore, the protective layer 32 should preferably be firmer than the sensing electrodes Rx. For the above reasons, the protective layer 32 should preferably be formed of (meth)acrylate resin. The adhesive member 34 is a resin adhesive member to adhere the protective layer 32 and the second base material BA2. In view of transparency and durability, the adhesive member 34 should preferably be a pressure sensitive adhesive member formed of (meth)acrylate resin. That is, the adhesive layer 30 should preferably be formed of (meth)acrylate resin. The adhesive layer 30 is not limited to the double-layered structure of the protective layer and the adhesive member, and may be a single layer or a laminated layer of three or more layers.

The second base material BA2 overlaps an overlapping area OA of the first base material BA1. The overlapping area OA overlaps the entire display area DA. The percentage of an area in which the sensing electrodes Rx are formed to the entire overlapping area OA or the entire display area DA should preferably be 20% or less, more specifically, 10% or less. In one example, in the overlapping area OA, the percentage of the area in which the sensing electrodes Rx are formed is about 7% and the percentage of an area in which the sensing electrodes Rx are not formed and the first base material BA1 is exposed is about 93%.

Figure 3:
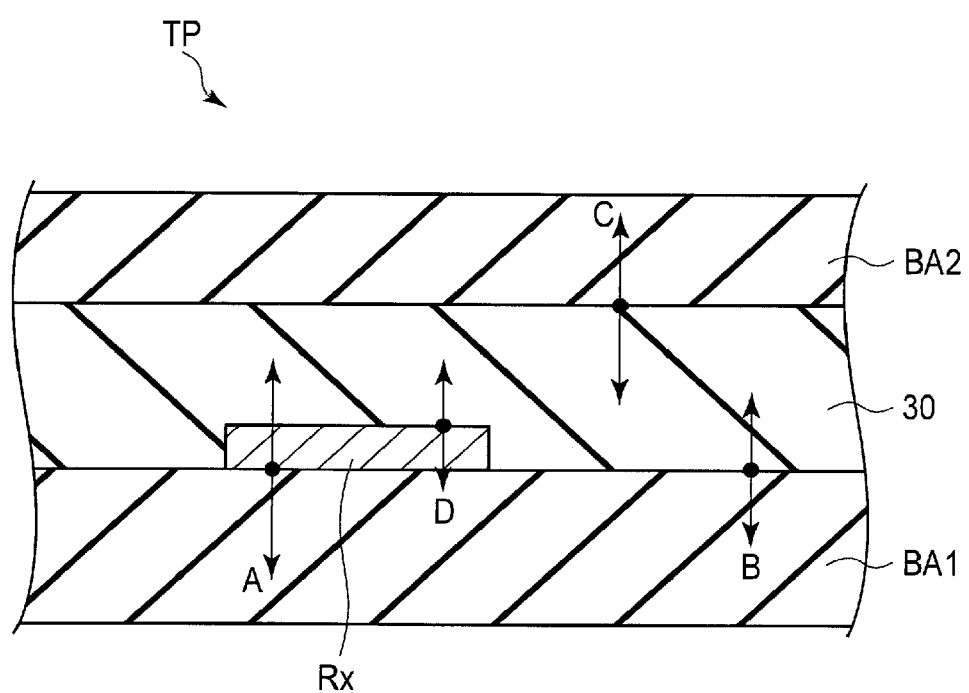
FIG. 3 is a cross-sectional view of the position detecting substrate.

FIG. 3 is a cross-sectional view of the position detecting substrate.

As illustrated, in the position detecting substrate TP, the sensing electrodes Rx are formed on the first base material BA1, the adhesive layer 30 faces the first base material BA1 and the sensing electrodes Rx, and the second base material BA2 is adhered to the first base material BA1 and the sensing electrodes Rx by the adhesive layer 30. Arrows A to D in FIG. 3 simply indicate adhesive forces between the members.

Adhesive force A is a quantity indicating adhesion between the first base material BA1 and the sensing electrodes Rx and the force required to peel the sensing electrodes Rx from the first base material BA1. Adhesive force B is a quantity indicating adhesion between the first base material BA1 and the adhesive layer 30 and the force required to peel the adhesive layer 30 from the first base material BA1. Adhesive force C is a quantity indicating adhesion between the second base material BA2 and the adhesive layer 30 and the force required to peel the second base material BA2 from the adhesive layer 30. Adhesive force D is a quantity indicating adhesion between the sensing electrodes Rx and the adhesive layer 30 and the force required to peel the adhesive layer 30 from the sensing electrodes Rx.

In the present embodiment, adhesive force A is greater than adhesive force B (A>B), or greater than adhesive force C (A>C). Furthermore, adhesive force A should preferably be greater than adhesive force D (A>D). Moreover, it is preferable that adhesive force C be greater than adhesive force B and adhesive force B be greater than adhesive force D (C>B>D), or that adhesive force C be greater than adhesive force D and adhesive force D be greater than adhesive force B (C>D>B). That is, the adhesion between the first base material BA1 and the sensing electrodes Rx is the strongest when comparing the adhesion properties between the first base material BA1, the sensing electrodes Rx, the adhesive layer 30 and the second base material BA2.

In this case, the first base material BA1 and the second base material BA2 are peeled in some patterns. The first peeling pattern is a pattern of interfacial peeling between the adhesive layer 30 and the second base material BA2. In this pattern, the entire adhesive layer 30 is separated from the second base material BA2. The second peeling pattern is a pattern of interfacial peeling between the first base material BA1 and the sensing electrodes Rx, and the adhesive layer 30. In this pattern, the entire adhesive layer 30 is separated from the first base material BA1 with the second base material BA2 adhered. The third peeling pattern is a pattern of peeling caused by internal fracture of the adhesive layer 30. In the third peeling pattern, for example, the adhesive layer 30 is peeled from the first base material BA1 but remains adhered to the sensing electrodes Rx, the adhesive layer 30 is peeled from the sensing electrodes Rx but remains adhered to the first base material BA1, the protective layer 32 and the adhesive member 34 are peeled from each other, and the protective layer 32 and/or the adhesive layer 34 break apart because of cohesive failure. In all the patterns, the sensing electrodes Rx are not peeled from the first base material BA1. Only the second base material BA2 or at least part of the second base material BA2 and the adhesive layer 30 is peeled from the first base material BA1.

<Resin Included in Adhesive Layer>

What is important for realization of the above-described magnitude relationship between the adhesive forces is the adhesive force of the adhesive layer 30 to each member. The selection of material of the adhesive layer 30 is critically important in realizing such adhesive forces. In the present embodiment, resin used to form the adhesive layer 30, i.e., the protective layer 32 and the adhesive member 34, should preferably be resin obtained by polymerizing (meth)acrylate monomers having no hydroxy group. Specifically, the resin should preferably include a constitutional unit of the following formula (1) derived from (meth)acrylate monomers. More specifically, the percentage of monomers of the constitutional unit of the following formula (1) to the resin should preferably be 30 wt % or more (even specifically, 50 wt % or more). In the formula (1), R1 is an alkyl group or an aralkyl group which has no hydroxy group, may have an oxide and has a carbon number of 20 or less, or hydrogen. R2 is a methyl group or hydrogen. The resin may include other well-known polymerizable monomer, photopolymerization initiator and addition agent.

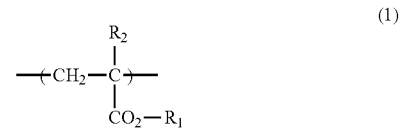

As monomers corresponding to the above formula, for example, the following can be used: stearyl (meth)acrylate, lauryl (meth)acrylate, octyl (meth)acrylate, decyl (meth)acrylate, (iso)myristyl (meth)acrylate, isostearyl (meth)acrylate, 2-ethylhexyl-diglycol (meth)acrylate, butoxyethyl (meth)acrylate, ethoxydiethylene glycol (meth)acrylate, methoxydiethylene glycol (meth)acrylate, methoxypropylene glycol (meth)acrylate, phenoxyethyl (meth)acrylate, benzyl (meth)acrylate, t-butylcyclohexyl (meth)acrylate, and dicyclopentanyl(meth)acrylate.

As a photopolymerization initiator, for example, the following can be used: aromatic ketone, acylphosphine oxide compound, thioxanthone compound, aromatic onium salt compound, thio compound (for example, compound having thiophenyl group), α-aminoalkyl phenone compound, hexaarylbiimidazole compound, ketoxime ester compound, borate compound, azinium compound, metallocene compound, active ester compound, compound having carbon-halogen bond, and alkylamine compound.

As polymerizable monomers other than the above formula (1), for example, monomers disclosed in US Patent No. 2004/0024091 can be used.

In the present embodiment, it is preferable that the resin substantially exclude a thermal polymerization initiator. In other words, it is preferable that the amount of the thermal polymerization initiator is less than a sufficient amount to serve the purpose. For example, the percentage of the thermal polymerization initiator to the UV curable resin or the material of the protective layer should preferably be less than 0.5 wt %, specifically less than 0.1 wt %, more specifically less than 0.05 wt %. In the present embodiment, a mother panel applied with the material of the protective layer comprises a liquid crystal layer, a transparent base material and the like which are comparatively weak against heat. In addition, the adhesive force of the thermal polymerization resin tends to be excessively high. Therefore, a photocurable resin (for example, ultraviolet [UV] curable resin) cured by a photopolymerization reaction should preferably be used for the protective layer. Further, it is preferable that the material of the protective layer substantially exclude a thermal polymerization initiator.

The thermal polymerization initiator is, for example, peroxide and azo compound.

A glass-transition temperature Tg of the (meth)acrylate monomer of the above formula (1) should preferably be −60 to 40° C. This means that Tg of a homopolymer of the (meth)acrylate monomer or theoretical Tg of a copolymer calculated by the FOX equation is −60 to 40° C.

The adhesive layer 30 may include inorganic particles. Such inorganic particles may be, for example, inorganic oxide, calcium carbonate, talc, clay, calcined kaolin, calcined calcium silicate, hydrated calcium silicate, aluminum silicate, magnesium silicate, calcium phosphate or the like. Silica and alumina are particularly suitable as inorganic particles included in the adhesive layer 30 because silica and alumina are excellent in transparency, have low haze and are uncolored, thus having little effect on the optical characteristics of a polarizer when the second base material BA2 is a polarizer. In particular, silica is preferable also because silica is excellently and stably dispersed into the adhesive layer 30.

If the adhesive layer 30 or the protective layer 32 is too hard, adhesive force B is decreased, which raises the possibility that the protective layer 32 is peeled from the first base material BA1 in a cleaning process of the first base material BA1, etc. Therefore, the Martens hardness of the adhesive layer 30 or the protective layer 32 should preferably be 5 to 50 N/mm2. The Martens hardness quantifies a physical property specified by ISO 14577 and measured by pressing an indenter into an object of interest under load.

FIG. 4 is a flowchart partially showing a manufacturing process of the display device.

An example of the method of manufacturing the display device of the present embodiment is hereinafter described. First, a first mother substrate in which first substrates SUB1 are formed and a second mother substrate in which second substrates SUB2 are formed are prepared. Next, a sealing member is applied to and a liquid crystal material is dropped to the first mother substrate or the second mother substrate. Then, the first mother substrate and the second mother substrate are adhered. A mother panel having areas corresponding to display panels is thereby manufactured. Subsequently, sensing electrodes are formed by forming a film of a metal material in the areas of the surface of the second mother substrate corresponding to the display panels and patterning the metal material. After that, a protective layer for protecting the sensing electrodes is formed and a second base material is adhered. Steps after forming the sensing electrodes are hereinafter described in detail.

In step 1 "Application of material of protective layer", the material for forming the protective layer includes a resin material. The material of the protective layer is applied to the areas of the mother panel corresponding to the display panels PNL by, for example, ink-jet printing.

In step 2 "Curing of material of protective layer", the material of the protective layer is cured by a polymerization reaction. In general, a thermal polymerization reaction and a photopolymerization reaction are known as polymerization reactions. In the present embodiment, the protective layer may be formed of a photocurable resin (for example, ultraviolet [UV] curable resin) cured by a photopolymerization reaction for the aforementioned reason.

In step 3 "Bonding of second base material", the second base material is adhered to the protective layer by the adhesive member. The second base material is a transparent glass or resin base material and is, for example, an optical element including a polarizer as shown in FIG. 2.

In step 4 "Defect inspection of protective layer", a fault (defect) in film formation such as a lack of protective layer and a foreign matter in the protective layer is inspected. The defect inspection is, for example, a visual inspection, a bright spot inspection by measuring transmitted light, etc. If no defect is found in the mother panel in this step, the process proceeds to step 5-1 "Panel cut". If any defect is found in the mother panel, the process proceeds to step 5-2 "Peeling of protective layer".

In step 5-1 "Panel cut", the mother panel is cut per display panel. In step 5-2 "Peeling of protective layer", the second base material is peeled from an area corresponding to a display panel having the defect. When the second base material is peeled, both the protective layer and the adhesive member having the defect are entirely left on the mother panel, part of the protective layer and part of the adhesive member are left on the mother panel, the entire adhesive member is removed together with the second base material and at least part of the protective layer is left on the mother panel, or both the protective layer and the adhesive member are entirely removed from the mother panel together with the second base material. At this time, the sensing electrodes are not peeled from the mother panel. If at least part of the protective layer and the adhesive member is left on the mother panel when peeling the second base material, the residue is removed. For example, the residue may be removed by means of an adhesive tape and a solvent or by ultrasonic cleaning, etc.

In step 6 "Reformation of protective layer", a protective layer is formed again in the area of the mother panel corresponding to the display panel from which the protective layer is removed. In this step, step 1 "Application of material of protective layer" and step 2 "Curing of material of protective layer" are performed again in the area from which the protective layer is removed. After the protective layer is formed again, the second base material is adhered to the area of the display panel in which the protective layer is formed again and then the panel is cut.

The step "Defect inspection of protective layer" may be performed before the step "Bonding of second base material". If a defect is found in the protective layer on the defect inspection before adhering the second base material, the protective layer can be removed by the foregoing means. When using an adhesive tape, the adhesive force of the tape to the protective layer should preferably be greater than the adhesive force between the first base material and the protective layer. The step "Defect inspection of protective layer" may be performed after the step "Panel Cut". If a defect is found in the protective layer on the defect inspection after cutting the panel, the steps "Peeling of protective layer" and "Reformation of protective layer" are performed per display panel.

FIG. 5 is an illustration of the mother panel in the step "Curing of material of protective layer" shown in FIG. 4.

A mother panel MOT comprises display panels PNL1 and display panel PNL2. Protective layers 32 are normally formed in areas corresponding to display panels PNL1. A defective protective layer 32 is formed in an area corresponding to display panel PNL2. In the example illustrated, the defective protective layer 32 is a protective layer partly chipped because of a defective application of the material of protective layer.

FIG. 6 is an illustration of the mother panel in the step "Peeling of protective layer" shown in FIG. 4.

The second base materials BA2 are attached to the areas corresponding to display panels PNL1 so as to overlap the protective layers 32. In the area corresponding to display panel PNL2, the defective protective layer 32 is removed by peeling the second base material BA2. After that, the mother panel MOT proceeds to the step "Reformation of protective layer" and a protective layer is formed on display panel PNL2.

As described above, in the present embodiment, adhesive force A between the first base material and the sensing electrodes, adhesive force B between the first base material and the adhesive layer, and adhesive force C between the adhesive layer and the second base material are such that A>B or A>C. Therefore, the second base material can be peeled from the first base material without peeling the sensing electrodes from the first base material. That is, the sensing electrodes can be prevented from being peeled from the first base material when peeling the second base material even if the adhesive layer has a defect. Therefore, the first base material including the sensing electrodes can be used again. As a result, the yields of the position detecting substrates can be improved and the manufacturing costs of the position detecting substrates can be reduced.

In addition, in the position detecting substrates, adhesive force D between the sensing electrodes and the adhesive layer is such that of A>D. Adhesive force D is also such that C>B>D or C>D>B. Therefore, when peeling second base material, the entire adhesive layer is peeled from the first base material together with the second base material, or part of the adhesive layer is peeled from the first base material together with the second base material because of internal fracture of the adhesive layer. If the entire adhesive layer is peeled from the first base material, the step of removing a residue of the adhesive layer on the surface of the first base material and the sensing electrodes can be omitted. Even if part of the adhesive layer is left on the surface of the first base material and the sensing electrodes, the residue can be easily removed by cleaning.

The adhesive layer is formed of resin obtained by polymerizing (meth)acrylate having no hydroxy group. Since the adhesive layer does not include a hydroxy group having a high reactivity, the adhesive force of the adhesive layer with the first base material and the sensing electrodes can be prevented from being too high while keeping the adhesive force with each member. That is, adhesive forces B and C can be less than adhesive force A.

The reduction in aperture ratio of the display area caused by thinned sensing electrodes can be prevented since the area occupied by the sensing electrodes is 20% or less in the overlapping area of the first and second base materials. In addition, the reflection of external light caused by the sensing electrodes can be reduced. That is, a display device comprising the position detecting substrate of the present embodiment can reduce deterioration of display quality. Since the thinned sensing electrodes are protected by an adhesive layer including a protective layer having comparatively-high hardness, the sensing electrodes can be prevented from being damaged, peeled and broken. Even if a defect occurs in the protective layer included in the adhesive layer and the protective layer is required to be removed, damage to the sensing electrodes can be reduced when peeling the second base material as described above.

A homopolymer of the (meth)acrylate monomer polymerized to form the resin forming the adhesive layer should preferably have Tg of −60 to 40° C. in order to achieve adhesive forces B, C and D suitable for adhering of the first and second base materials, protection of the sensing electrodes and easy peeling at the time of defect occurrence. The adhesive layer may include addition agent, for example, inorganic particles. Since the hardness of the adhesive layer can be changed by the addition of the inorganic particles, the adhesive layer or the protective layer having hardness suitable for the present embodiment can be formed.

Next, a modified embodiment of the present embodiment is described. A constituent element that performs a function equivalent or similar to that of the aforementioned constituent element is represented by the same reference number and the overlapping description is omitted.

FIG. 7 is a cross-sectional view of another display panel comprising the position detecting substrate.

A display device DSP comprises a display panel PNL and a position detecting substrate TP. The display panel PNL comprises a first optical element OD1 on one principal surface, and a second optical element OD2 on the other principal surface. The position detecting substrate TP faces a surface of the display panel PNL comprising the second optical element OD2. The position detecting substrate TP comprises a first base material BA1, driving electrodes Tx, sensing electrodes Rx, an adhesive layer 30 and a second base material BA2. The driving electrodes Tx are formed on a first principal surface BA1A of the first base material BA1 facing the display panel PNL. The sensing electrodes Rx are formed on a second principal surface BA1B of the first base material BA1 opposite to the driving electrodes Tx. The second base material BA2 is adhered to the first base material BA1 by the adhesive layer 30 covering the sensing electrodes Rx. The adhesive layer 30 includes a protective layer 32 covering the sensing electrodes Rx and an adhesive member 34 for adhering the second base material BA2.

In such a modified embodiment, the adhesive layer 30 has adhesive forces with the first base material BA1, the sensing electrodes Rx and the second base material BA2 satisfying the aforementioned relationship. Therefore, the same effect as the aforementioned embodiment can be achieved in the modified embodiment.

As described above, the present embodiment can provide a position detecting substrate and a display device capable of reducing manufacturing costs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A position detecting substrate comprising:
   a first base material;
   a sensing electrode formed of metal on the first base material and configured to detect a position;
   an adhesive layer facing the first base material and the sensing electrode and including a resin; and
   a second base material adhered to the sensing electrode by the adhesive layer, wherein
   assuming force required to peel the sensing electrode from the first base material to be A, force required to peel the adhesive layer from the first base material to be B, and force required to peel the second base material from the adhesive layer to be C, then A>B, or A>C, and
   assuming force required to peel the adhesive layer from the sensing electrode to be D, then A>D.

2. The position detecting substrate of claim 1, wherein
   C>B>D, or C>D>B.

3. The position detecting substrate of claim 1, wherein the resin is formed by polymerizing (meth)acrylate monomers having no hydroxy group.

4. The position detecting substrate of claim 3, wherein the resin includes a constitutional unit of formula (1) derived from the (meth)acrylate monomers

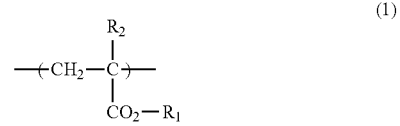

where R1 indicates an alkyl group or an aralkyl group which has no hydroxy group, may have an oxide and has a carbon number of 20 or less, or hydrogen, and R2 indicates a methyl group or hydrogen.

5. The position detecting substrate of claim 3, wherein a glass-transition temperature Tg of the (meth)acrylate monomers is −60 to 40° C.

6. The position detecting substrate of claim 3, wherein the adhesive layer includes inorganic particles.

7. The position detecting substrate of claim 1, wherein in an overlapping area of the first base material in which the first base material and the second base material overlap one another, an area occupied by the sensing electrode is 20% or less of the overlapping area.

8. A position detecting substrate comprising:
a first base material;
a sensing electrode formed of metal on the first base material and configured to detect a position;
an adhesive layer facing the first base material and the sensing electrode and including a resin; and
a second base material adhered to the sensing electrode by the adhesive layer, wherein
assuming force required to peel the sensing electrode from the first base material to be A, force required to peel the adhesive layer from the first base material to be B, and force required to peel the second base material from the adhesive layer to be C, then A>B, or A>C, and
in an overlapping area of the first base material in which the first base material and the second base material overlap one another, an area occupied by the sensing electrode is 20% or less of the overlapping area.

9. The position detecting substrate of claim 8, wherein the resin is formed by polymerizing (meth)acrylate monomers having no hydroxy group.

10. The position detecting substrate of claim 9, wherein the resin includes a constitutional unit of formula (1) derived from the (meth)acrylate monomers

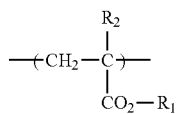

(1)

where R1 indicates an alkyl group or an aralkyl group which has no hydroxy group, may have an oxide and has a carbon number of 20 or less, or hydrogen, and R2 indicates a methyl group or hydrogen.

11. The position detecting substrate of claim 9, wherein the adhesive layer includes inorganic particles.

12. A position detecting substrate comprising:
a first base material;
a sensing electrode formed of metal on the first base material and configured to detect a position;
an adhesive layer facing the first base material and the sensing electrode and including a resin; and
a second base material adhered to the sensing electrode by the adhesive layer, wherein
assuming force required to peel the sensing electrode from the first base material to be A, force required to peel the adhesive layer from the first base material to be B, and force required to peel the second base material from the adhesive layer to be C, then A>B, or A>C,
the resin is formed by polymerizing (meth)acrylate monomers having no hydroxy group, and
a glass-transition temperature Tg of the (meth)acrylate monomers is −60 to 40° C.

13. The position detecting substrate of claim 12, wherein the resin includes a constitutional unit of formula (1) derived from the (meth)acrylate monomers

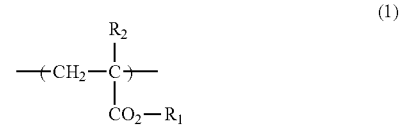

where R1 indicates an alkyl group or an aralkyl group which has no hydroxy group, may have an oxide and has a carbon number of 20 or less, or hydrogen, and R2 indicates a methyl group or hydrogen.

14. The position detecting substrate of claim 12, wherein the adhesive layer includes inorganic particles.

* * * * *